United States Patent [19]

Hadimioglu et al.

[11] Patent Number: 4,749,900

[45] Date of Patent: Jun. 7, 1988

[54] MULTI-LAYER ACOUSTIC TRANSDUCER FOR HIGH FREQUENCY ULTRASOUND

[75] Inventors: Babur B. Hadimioglu, Mountain View; Butrus T. Khuri-Yakub, Palo Alto; Calvin F. Quate, Stanford, all of Calif.

[73] Assignee: The Board of Trustees of the Leland Stanford Junior University, Stanford, Calif.

[21] Appl. No.: 931,602

[22] Filed: Nov. 17, 1986

[51] Int. Cl.⁴ .................................... H01L 41/08
[52] U.S. Cl. ................... 310/334; 310/360; 310/357; 310/359; 252/62.9; 427/100; 29/25.35
[58] Field of Search ............... 310/360, 357, 359, 334; 29/25, 35; 252/62.2, 62.9 R; 427/100

[56] References Cited

U.S. PATENT DOCUMENTS

| | | | |
|---|---|---|---|
| 3,091,707 | 5/1963 | Hutson | 310/360 |
| 3,471,721 | 10/1969 | Moore | 310/360 X |
| 3,497,727 | 2/1970 | DeKlerk et al. | 310/334 X |
| 3,506,858 | 4/1970 | Shaw | 310/333 |
| 3,590,287 | 6/1971 | Berlincourt et al. | 310/359 X |
| 3,846,649 | 11/1974 | Lehmann et al. | 310/360 X |
| 4,142,124 | 2/1979 | Ogawa et al. | 310/360 |
| 4,164,676 | 8/1979 | Nishiyama et al. | 310/360 |
| 4,590,399 | 5/1986 | Roxolo et al. | 310/334 |

*Primary Examiner*—Mark O. Budd
*Attorney, Agent, or Firm*—Flehr, Hohbach, Test, Albritton & Herbert

[57] ABSTRACT

The invention relates to a multi-layered piezoelectric acoustic transducer for generating layers of the same piezoelectric material are provided such tool alternate layers have different crystallographic orientations and different piezoelectric coupling coefficients. The layers may be provided so that alternate layers have crystallographic orientations which provide maximum electro-acoustic coupling and layers which provide minimum electro-acoustic coupling.

4 Claims, 2 Drawing Sheets

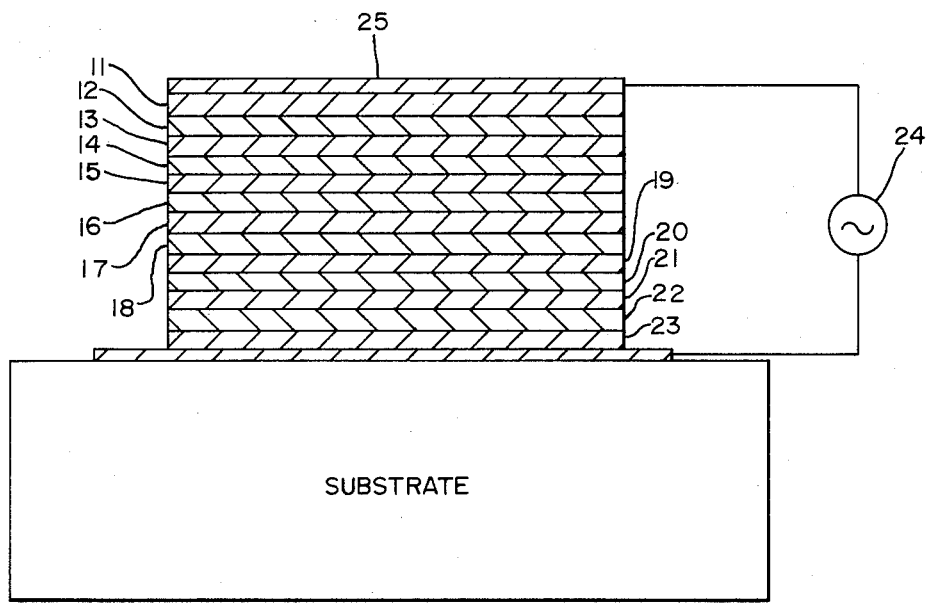
FIG.—1
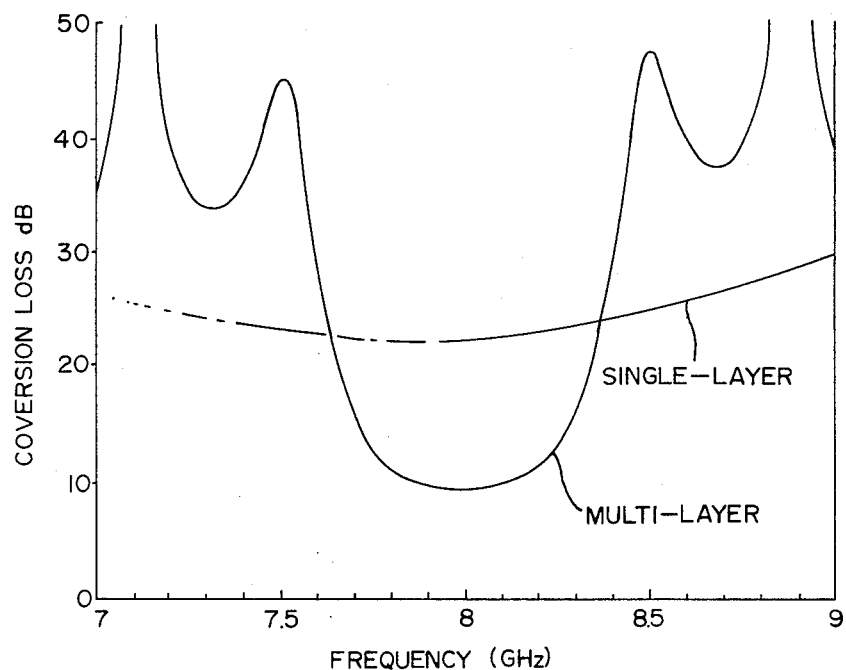
FIG.—2

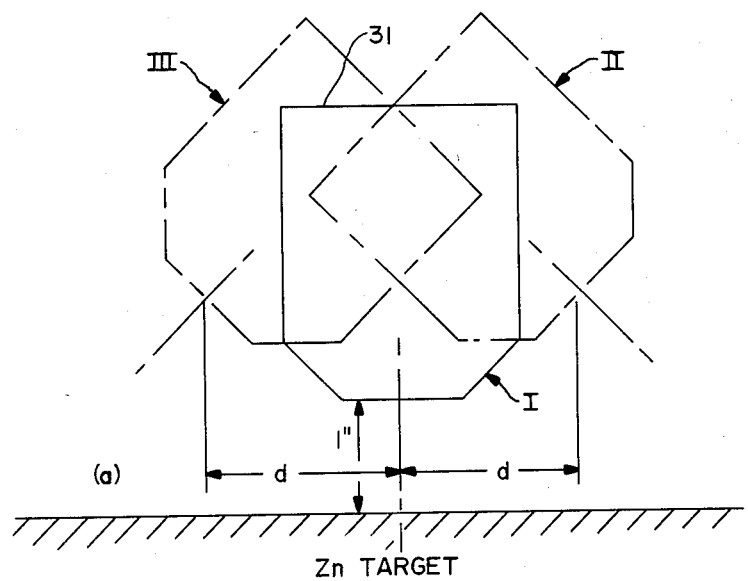
FIG.—3
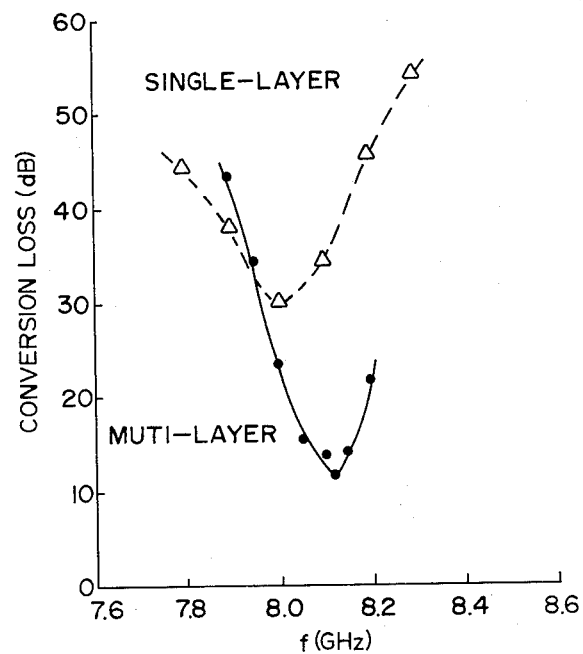
FIG.—4

MULTI-LAYER ACOUSTIC TRANSDUCER FOR HIGH FREQUENCY ULTRASOUND

The U.S. Goverment has certain rights in the claimed invention pursuant to National Science Foundation Grant Number EC 584-01797.

This invention relates to a multi-layer acoustic transducer for generating high frequency ultrasound energy and more particularly to a high frequency transducer having multiple layers of the same material with alternate layers having different crystallographic orientation and different piezoelectric coupling coefficients.

It is known that a multi-layer acoustic transducer structure consisting of alternate layers of two acoustic materials, one which is active and another which is passive, can increase the efficiency of the transducer because of better electro-acoustic coupling. It is also known that each layer of the structure should be about one-half acoustic wavelength thick at the operating frequency to provide additive reinforcement of the acoustic wave as it is generated by the successive active layers. The passive layers provide a means for impedance matching whereby the electrical impedance of the transducer matches the impedance of the electrical source to provide efficient energy transfer from electrial to acoustic energy.

Although it is known that multi-layer acoustic transducer structures provide enhanced conversion of electrical to acoustic energy, such transducers have not been available. This is due to the fact that the formation of alternate layers of different material require that the deposition of layers take place under different conditions, that is, that deposition of the active piezoelectric layers is carried out under first conditions generally in a first deposition chamber and the passive matching layers are formed in a second deposition carried out in a different chamber with different materials and under different conditions. With multiple layer structures the transducer is alternately moved from one deposition chamber to the next. This is a time consuming procedure and often leads to contamination of the layer material as it is moved from one deposition chamber to another. Furthermore, since the transducers may be exposed to air between depositions, the layers may not adhere because of oxides or other contaminants.

It is an object of the present invention to provide a transducer which is composed of multiple layers of the same piezoelectric material.

It is another object of the present invention to provide a transducer which comprises multiple layers of the same piezoelectric material with alternate layers having different crystallographic orientations and coupling coefficients.

It is a further object of the present invention to provide a method of forming a piezoelectric transducer in which the layers of different crystallographic (coupling coefficients) orientations are formed in the same deposition chamber by changing the orientation of the substrate.

These and other objects of the invention are achieved by a transducer having alternate layers of the same piezoelectric material having crystallographic (coupling coefficients) orientations which provide maximum electro-acoustic coupling and layers which provide minimum electro-acoustic coupling. The objects are further achieved by a method of forming a multiple layer transducer by depositing the layers of the same piezoelectric material in a deposition apparatus with the crystal orientation of successive layers providing high and low electro-acoustical coupling.

The invention may be more clearly understood from the following description taken in conjunction with the accompanying drawings in which:

FIG. 1 is a sectional view of a transducer formed on a crystal substrate.

FIG. 2 shows the theoretical conversion loss versus frequency for a multiple layer and single layer transducer.

FIG. 3 is a schematic diagram showing a suitable deposition arrangement for forming a transducer in accordance with the invention.

FIG. 4 shows the conversion loss of a multiple layer and single layer zinc oxide transducer operating at liquid helium temperature.

Referring to FIG. 1, a transducer in accordance with the present invention includes a plurality of layers 11-23 of suitable piezoelectric material, preferably zinc oxide, with the layers, 11, 13, 15, 17, 19, 21 and 23 oriented with the C-axis parallel to the electric field 24 applied between the electrodes 25 and 26 to provide maximum electro-acoustic coupling. The layers 12, 14, 16, 18, 20 and 22 are oriented with the C-axis at an angle with respect to the electric field to provide reduced or minimum coupling. In a transducer with zinc oxide layers, the angle of orientation of the C-axis for the angled layers is preferably 40° whereby to provide minimum coupling although other angles will reduce the coupling and provide the enhanced effects in accordance with the present invention. Although zinc oxide has been indicated as a preferable material, other materials which can be deposited can be such as lithium niobate or cadmium sulfide.

The layers each have a thickness which corresponds to one-half the wavelength of the acoustic energy at the operating frequency whereby the acoustic waves in successive layers traveling from the top layer 11 to the layer 26 are in phase and couple to provide an additive effect and maximum output.

The use of the alternating layers parallel and angled with respect to the electric field provides and increase in the impedance and a good electrical match to the input electrical source 24 whereby to provide an efficient transfer of energy from the associated electrical circuits to the piezoelectric transducer.

As described above, the main constraint on multi-layer transducer fabrication is that the deposition should be done in a single deposition apparatus. This is required for ease of fabrication, preventing the transducer from getting dirty by exposure to air and also preventing any adhesion problems due to oxide coatings and the like in a multi-layer structure. For example, if zinc oxide is deposited from a zinc target in an argon oxygen atmosphere in a deposition station dedicated to zinc oxide growth it is undesirable to introduce other materials into the apparatus because the sputtering system would be contaminated.

In accordance with the present invention the same material zinc oxide or other piezoelectric material is deposited by changing the orientation of the substrate and therefore the crystal structure. In zinc oxide the optimum coupling between electrical signal and longitudinal acoustic wave is obtained with the C-axis of the zinc oxide oriented parallel to the electric field between the electrodes 25 and 26. As the axis is rotated from its normal direction, the acoustic coupling becomes weaker and the impedance increases. In fact, the longitudinal coupling coefficient is zero when the angle between the C-axis and the electric field is 40°.

FIG. 2 shows the theoretical improvement in transducer performance when a multi-layer system is employed. The two-way tuned conversion loss of a multi-layer transducer is plotted as a function of frequency. The transducer is of the type shown in FIG. 1 with the electro-mechanical coupling constant between alternating layers of 0.2 and 0.15. The remainder of the transducer parameters are as follows:

Transducer radius: 125 μm
Top-electrode 2000 Å gold
ZnO thickness: Each layer 4000 Å (half wave at 8GHz) thick
Counter-electrode: 2000 Å gold
Substrate: sapphire
Series resistance: 1 Ω
Total number of ZnO layers: 13

As a comparison, tuned conversion loss of a single zinc oxide layer with a coupling constant 0.2 is plotted. It can be seen that a significant improvement can be expected with a multi-layered structure.

Thin zinc oxide films with C-axis oriented at finite angles to the substrate may be grown by sputtering techniques. FIG. 3 shows a zinc target in a sputtering chamber with substrate holder 31 above the source. In accordance with one feature of the present invention, the substrate is first held in position I to deposit the film with the C-axis parallel to the electric field. The holder is then tilted to position II to form the C-axis at an angle. The holder is then tilted back to position I and then to position III, etc. When the substrate is tilted, the layers are deposited of non-uniform thickness with the thicker portion of the layer being closest to the target. By alternating the direction of the layers, a transducer having a uniform thickness can be grown. Thus the holder is moved between positions I, II and III to deposit the multi-layer structures and to provide a structure having a relative uniform thickness. The two-way conversion loss of a multi-layer transducer constructed in accordance with the foregoing operating at a temperature of 4° K. is plotted in FIG. 4 with the transducer parameters as follows:

Center frequency: 8GHz
ZnO thickness: 4000 Å (half-wave at 8GHz)
Top-electrode: 2000 Å gold
Counter-electrode: 1000 Å gold
Transducer radius: 125 μm
Substrate: sapphire
Total number of ZnO layers: 13 (7 normal, 6 tilted)
Substrate position (d): 1.5"

The transducer was tuned for operation at 8GHz in liquid helium. It can be seen that the minimum conversion loss is near 12 db with a bandwidth of approximately 200 MHZ. As a comparison, a two-way conversion loss of a single zinc oxide layer operating in similar conditions is plotted in FIG. 4. The loss of the single film is almost 20 db worse than the multi-layer case. It can also be seen that the bandwidths of the two transducers are approximately the same. This means that it is the electrical matching that works to determine the bandwidth of the transducers, not the acoustic resonance in the zinc oxide layers. Thus, multi-layer structures to not even show a significant reduction in bandwidth. Multi-layer zinc oxide transducers have also been constructed to operate at 12 GHz and two-way conversion losses as low as 20 db have been obtained. This is substantially better than a conventional single layer zinc oxide transducer operating at the same frequency.

We have also fabricated multi-layer transducers for operation at 32 and 96 GHz. Two-way untuned conversion losses of 24 and 51 db were measured at 32 and 96 GHz, respectively.

The different coupling can also be achieved by scrambling the orientation of the alternate layers by changing the deposition parameters such as: sputtering gas partial pressure, substrate temperature, substrate to target spacing, input sputtering power as a combination thereof.

Thus, there has been provided a multi-layer, piezoelectric transducer for operating with improved efficiency at relatively high frequencies.

What is claimed is:

1. A piezoelectric transducer comprising a substrate, a first conductive layer on said substrate, a multi-layer piezoelectric trnasducer carried on said conductive layer and a conductive layer on the surface of said transducer whereby an electrical field extending between said conductive layers can be applied to said transducer, said transducer characterized in that the layers are formed of the same piezoelectric material with a plurality of first spaced layers having their crystallographic axes aligned with the electric field to provide maximum coupling wiht the electric field and a plurality of second spaced layers having their crystallographic axis at an angle with respect to the field between said first layers to provide low coupling with the electric field.

2. A piezoelectric transducer as in claim 1 wherein the thickness of the layers is approximately one-half the wavelength at the acoustic operating frequency.

3. A piezoelectric transducer as in claim 1 wherein the layers are zinc oxide.

4. A piezoelectric transducer as in claim 3 wherein the C-axis of said first layers is parallel to the electric field and the C-axis of the second layers is at approximately 40° with respect to the electric field.

* * * * *